(12) United States Patent
Hayashi et al.

(10) Patent No.: US 12,249,858 B2
(45) Date of Patent: Mar. 11, 2025

(54) MARINE PROPULSION SYSTEM AND MARINE POWER SUPPLY SYSTEM INCLUDING A PLURALITY OF BATTERIES

(71) Applicant: YAMAHA HATSUDOKI KABUSHIKI KAISHA, Iwata (JP)

(72) Inventors: Takuya Hayashi, Shizuoka (JP); Yoshihiro Mizushima, Shizuoka (JP)

(73) Assignee: YAMAHA HATSUDOKI KABUSHIKI KAISHA, Shizuoka (JP)

( * ) Notice: Subject to any disclaimer, the term of this patent is extended or adjusted under 35 U.S.C. 154(b) by 773 days.

(21) Appl. No.: 17/412,311

(22) Filed: Aug. 26, 2021

(65) Prior Publication Data
US 2022/0073179 A1    Mar. 10, 2022

(30) Foreign Application Priority Data

Sep. 9, 2020    (JP) .................. 2020-151230

(51) Int. Cl.
*H02J 7/00*    (2006.01)
*B60L 1/00*    (2006.01)
(Continued)

(52) U.S. Cl.
CPC .............. *H02J 7/0048* (2020.01); *B60L 1/00* (2013.01); *B60L 15/20* (2013.01); *B60L 50/60* (2019.02);
(Continued)

(58) Field of Classification Search
CPC ......... H02J 7/0048; H02J 7/0063; B60L 1/00; B60L 15/20; B60L 50/60; B60L 50/61;
(Continued)

(56) References Cited

U.S. PATENT DOCUMENTS 8,043,132 B1    10/2011  Wyant
8,682,516 B1    3/2014   Balogh et al.
(Continued)

FOREIGN PATENT DOCUMENTS

EP    3279078 A1 *    2/2018    ............. B63H 21/21
EP    3613664 A1 *    2/2020    ............... B60K 6/26
(Continued)

OTHER PUBLICATIONS

Official Communication issued in corresponding European Patent Application No. 21194527.4, mailed on Feb. 21, 2022.

*Primary Examiner* — Richard Isla
*Assistant Examiner* — Manuel Hernandez
(74) *Attorney, Agent, or Firm* — Keating & Bennett, LLP

(57) ABSTRACT

A marine propulsion system includes a marine propulsion unit, a first battery for a starter of an engine, a second battery for an electric motor, a third battery for at least one of a plurality of devices in or on a marine vessel excluding the starter and the electric motor, and a charge amount acquisition controller configured or programmed to perform a control to acquire a charge amount of at least one of the first battery, the second battery, or the third battery based on a first power supplied from a power source to the first battery, the second battery, and the third battery, and a second power supplied from the first battery, the second battery, and the third battery to devices in or on the marine vessel.

16 Claims, 5 Drawing Sheets

(51) Int. Cl.
    *B60L 15/20*     (2006.01)
    *B60L 50/60*     (2019.01)
    *B60L 53/20*     (2019.01)
    *B60L 58/12*     (2019.01)
    *B60L 58/20*     (2019.01)
    *B63H 21/14*     (2006.01)
    *B63H 21/17*     (2006.01)
    *B63H 21/20*     (2006.01)
    *B63H 21/21*     (2006.01)
    *F02B 63/04*     (2006.01)
    *F02N 11/08*     (2006.01)
    *B60L 50/61*     (2019.01)
    *G01R 31/382*     (2019.01)
    *H01M 10/48*     (2006.01)

(52) U.S. Cl.
    CPC ............ *B60L 53/20* (2019.02); *B60L 58/12* (2019.02); *B60L 58/20* (2019.02); *B63H 21/14* (2013.01); *B63H 21/17* (2013.01); *B63H 21/20* (2013.01); *B63H 21/21* (2013.01); *F02B 63/042* (2013.01); *F02N 11/0862* (2013.01); *H02J 7/0063* (2013.01); *B60L 50/61* (2019.02); *B60L 50/66* (2019.02); *B60L 2240/529* (2013.01); *B60L 2240/549* (2013.01); *B63H 2021/202* (2013.01); *B63H 2021/205* (2013.01); *B63H 2021/216* (2013.01); *G01R 31/382* (2019.01); *H01M 10/48* (2013.01)

(58) Field of Classification Search
    CPC .......... B60L 50/66; B60L 53/20; B60L 58/12; B60L 58/20; B60L 2240/529; B60L 2240/549; B63H 21/14; B63H 21/17; B63H 21/20; B63H 21/21; B63H 2021/202; B63H 2021/205; B63H 2021/216; F02N 11/0862; G01R 31/382; H01M 10/48

USPC ........ 320/127, 128, 134, 136, 137, 149, 162
See application file for complete search history.

(56) References Cited

U.S. PATENT DOCUMENTS

| | | | |
|---|---|---|---|
| 9,054,555 B1* | 6/2015 | Ward | H02J 7/04 |
| 9,735,591 B2* | 8/2017 | Sato | H02J 7/0013 |
| 9,937,988 B2* | 4/2018 | Fukuda | B63H 20/00 |
| 11,447,223 B2* | 9/2022 | Ikegaya | H02J 7/0031 |
| 11,904,989 B2* | 2/2024 | Ikegaya | H02J 7/0024 |
| 2003/0076071 A1* | 4/2003 | Kanno | H02J 7/0048 |
| | | | 320/132 |
| 2010/0033130 A1* | 2/2010 | Mizushima | B63H 23/24 |
| | | | 320/126 |
| 2010/0100264 A1* | 4/2010 | Kato | B60K 6/365 |
| | | | 180/65.25 |
| 2010/0125383 A1 | 5/2010 | Caouette | |
| 2013/0140886 A1* | 6/2013 | Bito | H02J 7/0025 |
| | | | 307/10.7 |
| 2015/0155720 A1* | 6/2015 | Mise | H02J 7/35 |
| | | | 320/128 |
| 2016/0001719 A1* | 1/2016 | Frost | B60L 53/14 |
| | | | 307/20 |
| 2017/0291672 A1* | 10/2017 | Maejima | B63H 21/21 |
| 2017/0349256 A1 | 12/2017 | Nakamura | |
| 2018/0304763 A1* | 10/2018 | Moriya | B60W 10/26 |
| 2019/0248461 A1* | 8/2019 | Maejima | B63J 3/02 |
| 2020/0062362 A1 | 2/2020 | Nakamura et al. | |
| 2021/0309325 A1* | 10/2021 | Ikegaya | B63H 21/20 |
| 2022/0055499 A1* | 2/2022 | Moriya | B60L 58/20 |
| 2022/0081090 A1* | 3/2022 | Watanabe | H02J 7/00304 |
| 2022/0247200 A1* | 8/2022 | Mashimo | H02J 7/0048 |

FOREIGN PATENT DOCUMENTS

| | | | | |
|---|---|---|---|---|
| EP | | 3890152 A1 * | 10/2021 | ............ B63H 21/17 |
| EP | | 3890156 A1 * | 10/2021 | ............ B60L 50/16 |
| EP | | 4035989 A1 * | 8/2022 | ............ B60L 50/61 |
| JP | 2017-218016 A | | 12/2017 | |

\* cited by examiner (FIRST PREFERRED EMBODIMENT)

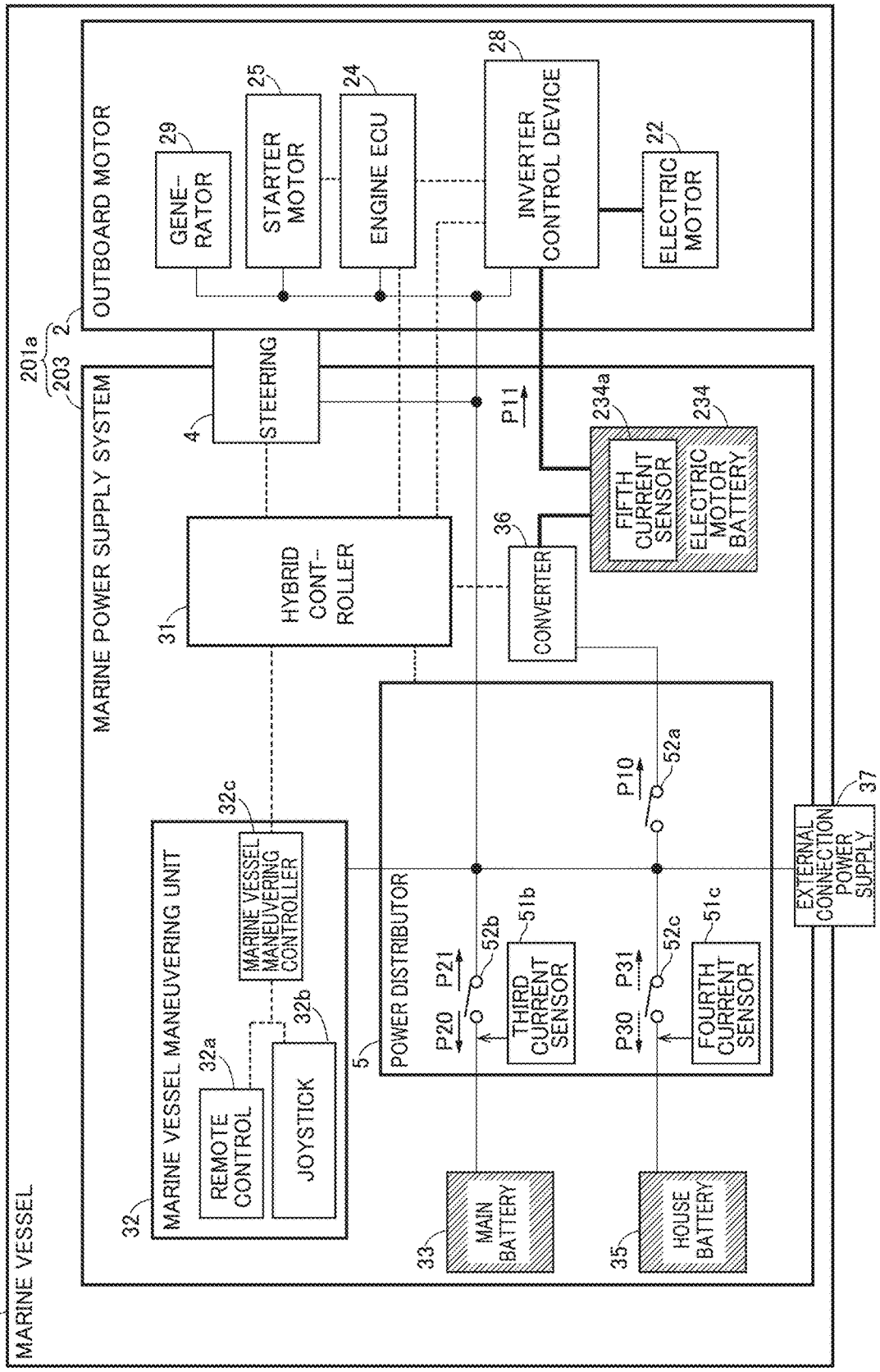
FIG. 6 (SECOND PREFERRED EMBODIMENT)

MARINE PROPULSION SYSTEM AND MARINE POWER SUPPLY SYSTEM INCLUDING A PLURALITY OF BATTERIES

CROSS REFERENCE TO RELATED APPLICATIONS

This application claims the benefit of priority to Japanese Patent Application No. 2020-151230 filed on Sep. 9, 2020. The entire contents of this application are hereby incorporated herein by reference.

BACKGROUND OF THE INVENTION

1. Field of the Invention

The present invention relates to a marine propulsion system and a marine power supply system.

2. Description of the Related Art

A marine propulsion system and a marine power supply system, both of which supply power to a marine propulsion unit including an engine and an electric motor, are known in general. Such a marine propulsion system and a marine power supply system are disclosed in Japanese Patent Laid-Open No. 2017-218016, for example.

Japanese Patent Laid-Open No. 2017-218016 discloses a marine vessel including a marine propulsion device (marine propulsion unit) including an engine and an electric motor. The marine propulsion device includes a propeller. Both the engine and the electric motor generate power to rotate the propeller. The marine vessel includes a starter motor, a first battery that supplies power to the starter motor, and a second battery that supplies power to the electric motor. The starter motor starts the engine using the power from the first battery. The electric motor rotates the propeller using the power from the second battery. Although not clearly described in Japanese Patent Laid-Open No. 2017-218016, generally, a marine vessel including a marine propulsion device separately includes a third battery to supply power to other devices in the marine vessel in addition to a first battery and a second battery to drive a propeller in order to ensure reliable driving of the propeller.

However, conventional marine vessels including the marine vessel disclosed in Japanese Patent Laid-Open No. 2017-218016 do not have a function of knowing the charge amounts of batteries (the first battery, the second battery, and the third battery) that supply power to the devices on the marine vessel. Therefore, a marine propulsion system and a marine power supply system that each know the charge amounts of batteries that supply power to devices on a marine vessel are desired.

SUMMARY OF THE INVENTION

Preferred embodiments of the present invention provide marine propulsion systems and marine power supply systems that know the charge amounts of batteries that supply power to devices in or on marine vessels.

A marine propulsion system according to a preferred embodiment of the present invention includes a marine propulsion unit including a propulsion generator, an engine to drive the propulsion generator, and an electric motor to drive the propulsion generator, a first battery to supply power to a starter to start the engine, a second battery to supply power to the electric motor, a third battery to supply power to at least one of a plurality of devices in or on a marine vessel excluding the starter and the electric motor, and a charge amount acquisition controller configured or programmed to perform a control to acquire a charge amount of at least one of the first battery, the second battery, or the third battery based on a first power supplied from a power source to the first battery, the second battery, and the third battery, and a second power supplied from the first battery, the second battery, and the third battery to devices in or on the marine vessel.

A marine propulsion system according to a preferred embodiment of the present invention includes the charge amount acquisition controller configured or programmed to perform a control to acquire the charge amount of at least one of the first battery, the second battery, or the third battery based on the first power supplied from the power source to the first battery, the second battery, and the third battery, and the second power supplied from the first battery, the second battery, and the third battery to the devices in or on the marine vessel. Accordingly, the charge amount acquisition controller acquires the charge amount of at least one of the first battery, the second battery, and the third battery based on the first power and the second power. That is, the charge amount of the battery (at least one of the first battery, the second battery, or the third battery) that supplies power to the devices in or on the marine vessel is known. When the charge amounts of at least two of the first battery, the second battery, or the third battery are known, necessary power management is performed according to the importance of a supply destination to which power is supplied. When the charge amounts of the batteries (the first battery and the second battery) used to drive the marine propulsion unit are known, a predetermined control to provide required power is performed in order to maintain driving of the marine vessel until returning to port.

A marine propulsion system according to a preferred embodiment of the present invention preferably further includes a power distributor connected to the first battery, the second battery, and the third battery to distribute the first power from the power source to the first battery, the second battery, and the third battery; the first battery and the third battery preferably supply the second power to the devices in or on the marine vessel via the power distributor; and the second battery preferably supplies the second power to the electric motor without interposition of the power distributor. Accordingly, in the power distributor, at least the first power and the second power of the first battery and the third battery are acquired, and at least the first power of the second battery is acquired. Therefore, the charge amounts of the first battery, the second battery, and the third battery that supply power to the devices in or on the marine vessel are easily known.

In such a case, the charge amount acquisition controller is preferably configured or programmed to perform a control to acquire a value of a current as the first power supplied to the second battery based on a value of a current that flows from the power distributor to the second battery, acquire a value of a current as the second power supplied to the electric motor based on a value of a current that flows from the second battery to the electric motor, and acquire the charge amount of the second battery based on the value of the current as the first power and the value of the current as the second power. Accordingly, the value of the current as the first power supplied to the second battery is acquired based on the value of the current that flows from the power distributor to the second battery, and the value of the current as the second power supplied to the electric motor is acquired based on the value of the current that flows from the second battery to the electric motor. Consequently, the charge amount of the second battery is reliably known based on the value of the current.

In a marine propulsion system including the charge amount acquisition controller configured or programmed to acquire the value of the current as the first power supplied to the second battery based on the value of the current that flows from the power distributor to the second battery and acquire the charge amount of the second battery, the electric motor preferably includes a power converter to convert the current as the second power supplied from the second battery from a direct current to an alternating current, the power converter preferably includes a first current sensor to detect the value of the current supplied to the electric motor, and the charge amount acquisition controller is preferably configured or programmed to perform a control to acquire the value of the current as the first power supplied to the second battery based on the value of the current detected by the first current sensor and acquire the charge amount of the second battery based on the value of the current as the first power and the value of the current as the second power. Accordingly, the value of the current as the second power supplied from the second battery is acquired by the first current sensor of the power converter provided in the electric motor. Thus, as compared with a case in which a dedicated current sensor is provided to acquire the value of the current as the second power, the number of components is reduced, and the system structure is simplified.

A marine propulsion system including the charge amount acquisition controller configured or programmed to acquire the value of the current as the first power supplied to the second battery based on the value of the current that flows from the power distributor to the second battery and acquire the charge amount of the second battery preferably further includes a converter provided between the power distributor and the second battery to boost a value of a voltage as the first power, and a second current sensor provided on a power distributor side relative to the converter to detect a value of a current that flows between the power distributor and the second battery. The charge amount acquisition controller is preferably configured or programmed to perform a control to acquire the value of the current as the first power supplied to the second battery based on the value of the current detected by the second current sensor and acquire the charge amount of the second battery based on the value of the current as the first power and the value of the current as the second power. Accordingly, the value of the current as the first power supplied to the second battery is acquired by the second current sensor on the upstream side in the current flow direction relative to the converter, and thus as compared with a case in which the current sensor is provided on the downstream side relative to the converter, the system structure on the downstream side relative to the converter is simplified.

In such a case, the power distributor preferably includes the second current sensor, and the charge amount acquisition controller is preferably configured or programmed to perform a control to acquire the value of the current as the first power supplied to the second battery based on the value of the current detected by the second current sensor and acquire the charge amount of the second battery based on the value of the current as the first power and the value of the current as the second power. Accordingly, the second current sensor of the power distributor acquires the value of the current as the first power supplied to the second battery. Thus, as compared with a case in which a dedicated current sensor is provided to acquire the value of the current as the first power, the number of components is reduced, and the system structure is simplified.

In a marine propulsion system including the power distributor including the second current sensor, the power distributor preferably includes a third current sensor to detect a value of a current that flows between the power distributor and the first battery, and the charge amount acquisition controller is preferably configured or programmed to perform a control to acquire the charge amount of the first battery based on the value of the current as the first power supplied to the first battery as detected by the third current sensor, and the value of the current as the second power. Accordingly, the two second and third current sensors are integrated into the power distributor, and thus the system structure is further simplified.

In a marine propulsion system including the power distributor including the third current sensor, the charge amount acquisition controller is preferably configured or programmed to perform a control to limit or stop a power supply to the second battery when the charge amount of the first battery is equal to or less than a charge amount threshold. Accordingly, the amount of power supplied to the second battery having the power source common to the first battery is reduced or reduced to zero, and thus the amount of power supplied to the first battery is increased.

In a marine propulsion system including the power distributor including the third current sensor, the power distributor preferably includes a fourth current sensor to detect a value of a current that flows between the power distributor and the third battery, and the charge amount acquisition controller is preferably configured or programmed to perform a control to acquire the charge amount of the third battery based on the value of the current as the first power supplied to the third battery as detected by the fourth current sensor, and the value of the current as the second power. Accordingly, the three second, third, and fourth current sensors are integrated into the power distributor, and thus the system structure is further simplified.

A marine propulsion system according to a preferred embodiment of the present invention preferably further includes an electric motor controller configured or programmed to perform a control to limit or stop driving of the electric motor based on the charge amount of the second battery. Accordingly, when the charge amount of the second battery is not sufficient, the amount of power supplied to the electric motor is reduced or reduced to zero, and thus the power consumption of the second battery is reduced.

In such a case, the power source preferably includes a generator mounted on the marine propulsion unit to generate power when the engine is driven. Accordingly, the generator generates power to supply the power to the first battery, the second battery, and the third battery.

In a marine propulsion system according to a preferred embodiment of the present invention, the second battery is preferably a lead storage battery. Accordingly, even in the lead storage battery that generally does not directly include a current sensor, the charge amount is known based on the first power supplied to the lead storage battery and the second power supplied from the lead storage battery.

In a marine propulsion system according to a preferred embodiment of the present invention, the second battery is preferably a lithium-ion battery, the lithium-ion battery preferably includes a fifth current sensor to detect a value of a current as the first power supplied from the power source to the lithium-ion battery and a value of a current as the second power supplied from the lithium-ion battery to the electric motor, and the charge amount acquisition controller is preferably configured or programmed to perform a control to acquire a charge amount of the lithium-ion battery based on the value of the current as the first power supplied to the lithium-ion battery as detected by the fifth current sensor, and the value of the current as the second power. Accordingly, both the value of the current as the first power supplied to the lithium-ion battery and the value of the current as the second power supplied from the lithium-ion battery to the electric motor are detected by the fifth current sensor generally provided in the lithium-ion battery. Therefore, as compared with a case in which a current sensor that detects the value of the current as the first power supplied to the lithium-ion battery and a current sensor that detects the value of the current as the second power supplied from the lithium-ion battery to the electric motor are provided separately from the lithium-ion battery, the number of components is reduced, and the system structure is simplified.

A marine power supply system according to a preferred embodiment of the present invention supplies power to a marine propulsion unit including a propulsion generator, an engine to drive the propulsion generator, and an electric motor to drive the propulsion generator, and includes a first battery to supply power to a starter to start the engine, a second battery to supply power to the electric motor, a third battery to supply power to at least one of a plurality of devices in or on a marine vessel excluding the starter and the electric motor, and a charge amount acquisition controller configured or programmed to perform a control to acquire a charge amount of at least one of the first battery, the second battery, or the third battery based on a first power supplied from a power source to the first battery, the second battery, and the third battery, and a second power supplied from the first battery, the second battery, and the third battery to devices in or on the marine vessel.

A marine power supply system according to a preferred embodiment of the present invention includes the charge amount acquisition controller configured or programmed to perform a control to acquire the charge amount of at least one of the first battery, the second battery, or the third battery based on the first power supplied from the power source to the first battery, the second battery, and the third battery, and the second power supplied from the first battery, the second battery, and the third battery to the devices in or on the marine vessel. Accordingly, the charge amount acquisition controller acquires the charge amount of at least one of the first battery, the second battery, and the third battery based on the first power and the second power. That is, the charge amount of the battery (at least one of the first battery, the second battery, or the third battery) that supplies power to the devices in or on the marine vessel is known. When the charge amounts of at least two of the first battery, the second battery, or the third battery are known, necessary power management is performed according to the importance of a supply destination to which power is supplied. When the charge amounts of the batteries (the first battery and the second battery) used to drive the marine propulsion unit are known, a predetermined control to provide required power is performed in order to maintain driving of the marine vessel until returning to port.

A marine power supply system according to a preferred embodiment of the present invention preferably further includes a power distributor connected to the first battery, the second battery, and the third battery to distribute the first power from the power source to the first battery, the second battery, and the third battery; the first battery and the third battery preferably supply the second power to the devices in or on the marine vessel via the power distributor; and the second battery preferably supplies the second power to the electric motor without interposition of the power distributor. Accordingly, in the power distributor, at least the first power and the second power of the first battery and the third battery are acquired, and at least the first power of the second battery is acquired. Therefore, the charge amounts of the first battery, the second battery, and the third battery that supply power to the devices in or on the marine vessel are easily known.

In such a case, the charge amount acquisition controller is preferably configured or programmed to perform a control to acquire a value of a current as the first power supplied to the second battery based on a value of a current that flows from the power distributor to the second battery, acquire a value of a current as the second power supplied to the electric motor based on a value of a current that flows from the second battery to the electric motor, and acquire the charge amount of the second battery based on the value of the current as the first power and the value of the current as the second power. Accordingly, the value of the current as the first power supplied to the second battery is acquired based on the value of the current that flows from the power distributor to the second battery, and the value of the current as the second power supplied to the electric motor is acquired based on the value of the current that flows from the second battery to the electric motor. Consequently, the charge amount of the second battery is reliably known based on the value of the current.

A marine power supply system according to a preferred embodiment of the present invention preferably further includes an electric motor controller configured or programmed to perform a control to limit or stop driving of the electric motor based on the charge amount of the second battery. Accordingly, when the charge amount of the second battery is not sufficient, the amount of power supplied to the electric motor is reduced or reduced to zero, and thus the power consumption of the second battery is reduced.

In a marine power supply system according to a preferred embodiment of the present invention, the second battery is preferably a lead storage battery. Accordingly, even in the lead storage battery that generally does not directly include a current sensor, the charge amount is known based on the first power supplied to the lead storage battery and the second power supplied from the lead storage battery.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 6 is a block diagram showing the structure of a marine vessel according to a second preferred embodiment of the present invention.

DETAILED DESCRIPTION OF THE PREFERRED EMBODIMENTS

Preferred embodiments of the present invention are hereinafter described with reference to the drawings.

First Preferred Embodiment

The structure of a marine propulsion system 1a according to a first preferred embodiment of the present invention is now described with reference to FIGS. 1 to 3. The marine propulsion system 1a is a component of a marine vessel 100. In the figures, arrow FWD represents the forward movement direction of the marine vessel 100, and arrow BWD represents the reverse movement direction of the marine vessel 100.

Figure 1:
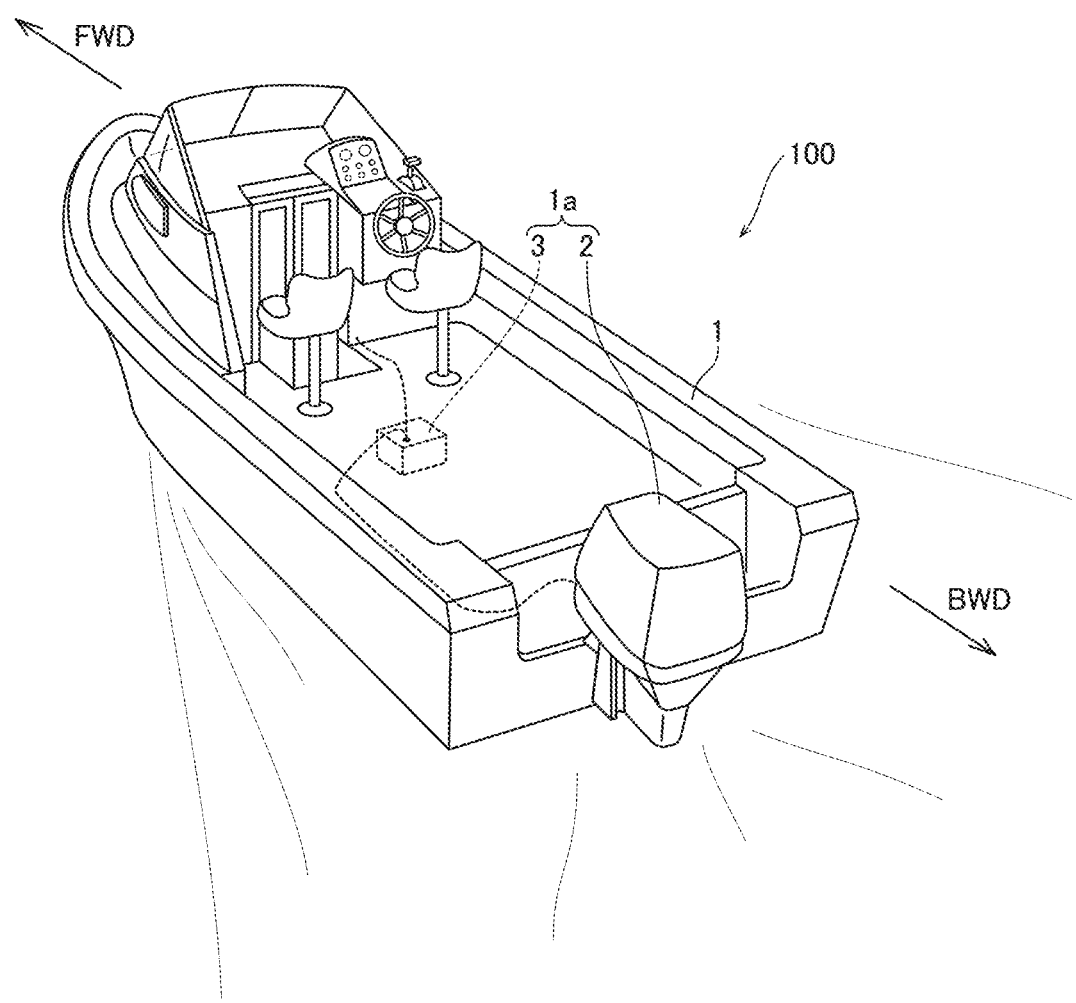
FIG. 1 is a perspective view schematically showing a marine vessel including a marine propulsion system according to a first preferred embodiment of the present invention.

As shown in FIG. 1, the marine vessel 100 includes a hull 1 and the marine propulsion system 1a.

The marine propulsion system 1a includes an outboard motor 2 and a marine power supply system 3. Furthermore, a steering 4 (see FIG. 2) is provided on the outboard motor 2. The outboard motor 2 is an example of a "marine propulsion unit".

The marine vessel 100 is an outboard motor boat. The marine power supply system 3 is a power supply system that supplies power to the outboard motor 2.

The marine propulsion system 1a according to the first preferred embodiment performs a control to acquire the charge amounts of a main battery 33, an electric motor battery 34, and a house battery 35 based on a first power P20, a first power P10, and a first power P30 (see FIG. 3) supplied (input) from a generator 29 of the outboard motor 2 to the main battery 33, the electric motor battery 34, and the house battery 35; and a second power P21, a second power P11, and a second power P31 (see FIG. 3) supplied (output) from the main battery 33, the electric motor battery 34, and the house battery 35 to devices in or on the marine vessel 100 with a hybrid controller 31 of the marine power supply system 3. The details are described below. In the description, the "first power (P10, P20, and P30)" refers to power input to each battery, and the "second power (P11, P21, and P31)" refers to power output from each battery. The hybrid controller 31 is an example of a "charge amount acquisition controller". The generator 29 is an example of a "power source". The main battery 33 is an example of a "first battery". The electric motor battery 34 is an example of a "second battery". The house battery 35 is an example of a "third battery".

Figure 2:
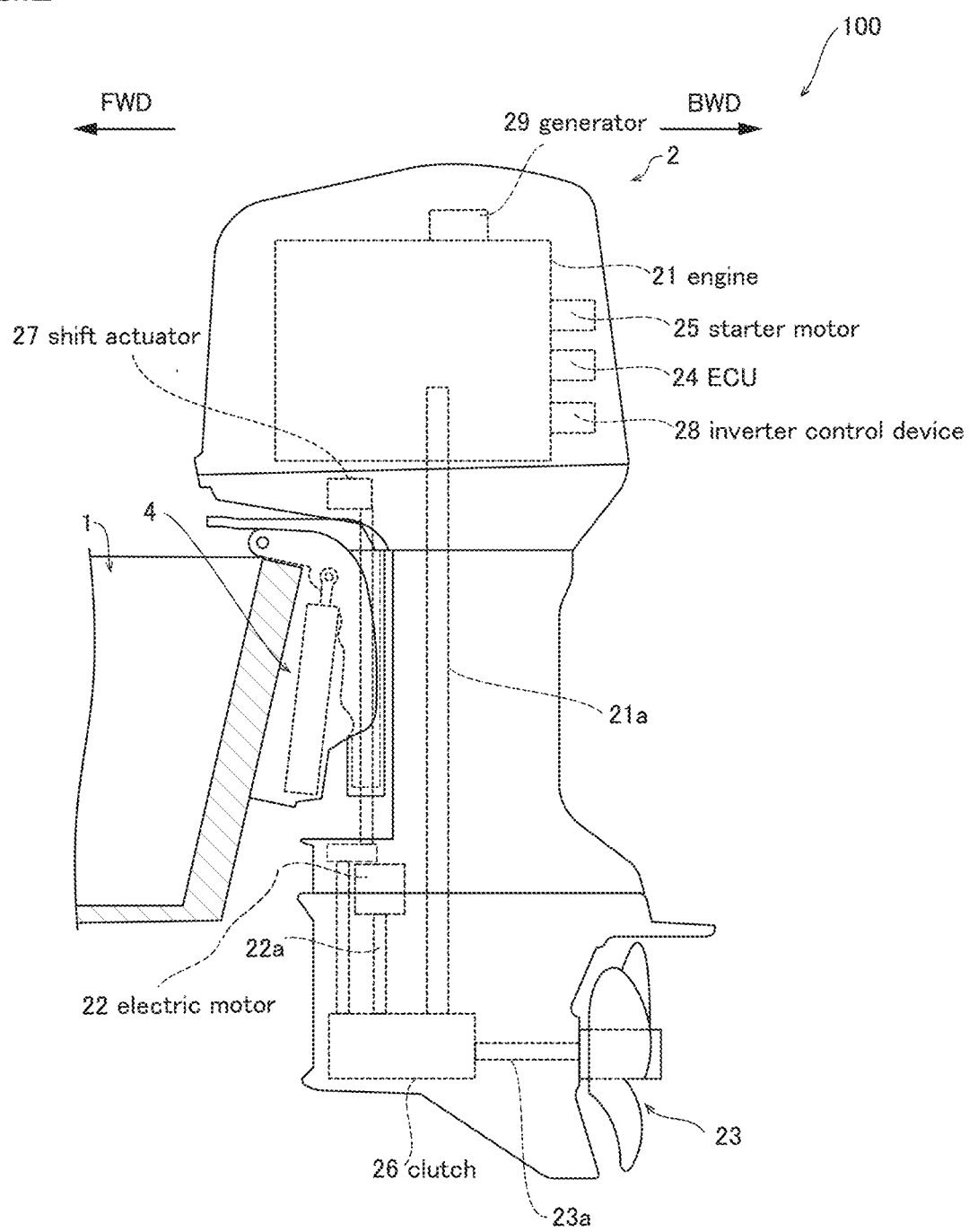
FIG. 2 is a side view illustrating the structure of an outboard motor according to the first preferred embodiment of the present invention.

As shown in FIG. 2, the outboard motor 2 is attached to the hull 1 via the steering 4. The outboard motor 2 includes an engine 21, an electric motor 22, a propeller 23, an engine electronic control unit (ECU) 24, a starter motor 25, a clutch 26, and a shift actuator 27. The propeller 23 is an example of a "propulsion generator". The starter motor 25 is an example of a "starter".

Figure 3:
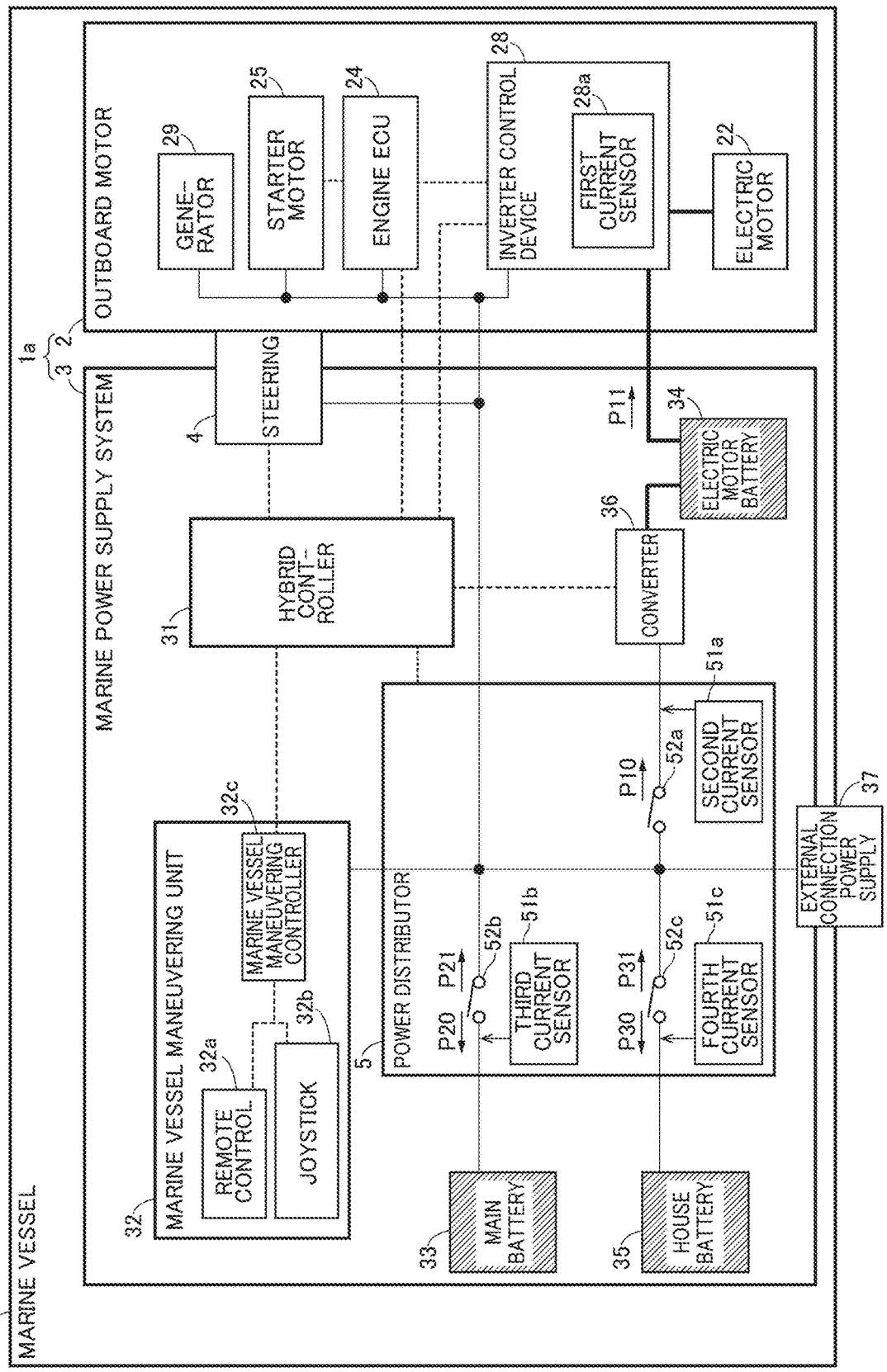
FIG. 3 is a block diagram showing the structure of the marine vessel according to the first preferred embodiment of the present invention.

As shown in FIG. 3, the outboard motor 2 includes an inverter control device 28 including a first current sensor 28a and the generator 29. The inverter control device 28 is an example of a "power converter" or an "electric motor controller".

The engine 21 drives the propeller 23. Specifically, the engine 21 is an internal combustion engine driven by explosive combustion of gasoline, light oil, or the like. The engine 21 is connected to the propeller 23 via a drive shaft 21a, the clutch 26, and a propeller shaft 23a. A driving force (rotational force) is transmitted from the engine 21 to the propeller 23 such that the propeller 23 rotates, and the marine vessel 100 (hull 1) is propelled.

The electric motor 22 drives the propeller 23. The electric motor 22 is a motor. The electric motor 22 is driven using power converted by the inverter control device 28. The electric motor 22 is connected to the propeller 23 via a shaft 22a, the clutch 26, and the propeller shaft 23a. A driving force (rotational force) is transmitted from the electric motor 22 to the propeller 23 such that the propeller 23 rotates, and the marine vessel 100 (hull 1) is propelled. The electric motor 22 drives and assists the clutch 26 (propeller shaft 23a) when the clutch 26 performs a switching operation described below. The propeller 23 is positioned in the water, and rotates to generate a propulsive force.

As shown in FIG. 3, the engine ECU 24 communicates with the hybrid controller 31 described below and the inverter control device 28. For example, the engine ECU 24 transmits and receives information and command signals to and from the hybrid controller 31 and the inverter control device 28 by controller area network (CAN) communication. The engine ECU 24 is connected to the main battery 33 via a power distributor 5. The engine ECU 24 operates using power from the main battery 33. In FIG. 3, dotted lines are shown as communication lines, and solid lines are shown as power lines. The communication lines may represent wired communication or wireless communication.

The starter motor 25 starts the engine 21. Specifically, the starter motor 25 is connected to the main battery 33 via the power distributor 5. The starter motor 25 is driven using the second power P21 from the main battery 33. The starter motor 25 rotates (cranks) a crankshaft of the engine 21 based on a command from the engine ECU 24 (hybrid controller 31). The engine 21 is cranked by the starter motor 25, fuel is supplied into the engine 21 by a fuel supplier (not shown), and the fuel in the engine 21 is ignited by an igniter (not shown) to start the engine 21. The second power P21 is supplied from the main battery 33 to the fuel supplier and the igniter.

As shown in FIG. 2, the clutch 26 is provided between the engine 21 and the propeller 23, and switches between a state in which a rotational force is transmitted from the engine 21 to the propeller 23 (a state in which "the shift position is at a forward movement position" or a state in which "the shift position is at a reverse movement position") and a state in which a rotational force is not transmitted from the engine 21 to the propeller 23 (a state in which "the shift position is at a neutral position") (performs the switching operation). The clutch 26 is a dog clutch, for example. The clutch 26 may be a friction clutch. The electric motor 22 rotates a gear in the clutch 26 or the propeller 23 such that the rotation of the gear in the clutch 26 or the propeller 23 is synchronized with rotation of the drive shaft 21a connected to the engine 21 before the clutch 26 performs the switching operation. The rotation speed of the gear in the clutch 26 and the rotation speed of the drive shaft 21a are close to each other, and thus the impact in the clutch 26 during the switching operation of the clutch 26 is reduced.

The shift actuator 27 moves the shift position between the forward movement position and the neutral position and moves the shift position between the reverse movement position and the neutral position based on commands from the hybrid controller 31.

The inverter control device 28 performs a control to convert a current as the second power P11 supplied from the electric motor battery 34 from a direct current to an alternating current and performs a control to supply AC power to the electric motor 22 that drives the propeller 23, based on a command from at least one of the hybrid controller 31 or the engine ECU 24.

The inverter control device 28 is provided with the first current sensor 28a that detects a value of a current that flows from the electric motor battery 34 to the inverter control device 28 (a value of a current as the second power P11 supplied from the electric motor battery 34 to the electric motor 22). The value of the current as the second power P11 detected by the first current sensor 28a is acquired by the hybrid controller 31.

The engine 21 is driven such that the generator 29 generates power and inputs the generated power to the power distributor 5. The generated power is supplied to the main battery 33, the electric motor battery 34, and the house battery 35 via the power distributor 5.

As shown in FIG. 3, the marine power supply system 3 includes the hybrid controller 31, a marine vessel maneuvering unit 32, the main battery 33, the electric motor battery 34, the house battery 35, a converter 36, an external connection power supply 37, and the power distributor 5.

The hybrid controller 31, the marine vessel maneuvering unit 32, the main battery 33, the electric motor battery 34, the house battery 35, the converter 36, the external connection power supply 37, and the power distributor 5 are provided in the hull 1, for example.

The marine vessel maneuvering unit 32 includes a remote control 32a, a joystick 32b, and a marine vessel maneuvering controller 32c. The remote control 32a and the joystick 32b receive input operations by an operator and transmit operation signals based on the received input operations to the marine vessel maneuvering controller 32c. The marine vessel maneuvering controller 32c includes a remote control ECU, and is configured or programmed to transmit the operation signals to the engine ECU 24 and the steering 4 via the hybrid controller 31.

The first power P20 is supplied (input) from the generator 29 or an external power supply (not shown) connected to the external connection power supply 37 to the main battery 33 via the power distributor 5. The main battery 33 supplies (outputs) the second power P21 to the starter motor 25 that starts the engine 21 via the power distributor 5. The main battery 33 is a lead storage battery or a lithium-ion battery.

The first power P10 is supplied (input) from the generator 29 or the external power supply (not shown) connected to the external connection power supply 37 to the electric motor battery 34 via the power distributor 5. The electric motor battery 34 supplies (outputs) the second power P11 to the electric motor 22 (inverter control device 28) without interposition of the power distributor 5, i.e., without the power distributor 5 being interposed between the electric motor battery 34 and the electric motor 22. The electric motor battery 34 is a lead storage battery.

The first power P30 is supplied (input) from the generator 29 or the external power supply (not shown) connected to the external connection power supply 37 to the house battery 35 via the power distributor 5. The house battery 35 supplies (outputs) the second power P31 to at least one (a device in a house) of devices in or on the marine vessel 100 excluding the electric motor 22 and the starter motor 25. The house battery 35 is a lead storage battery or a lithium-ion battery.

That is, the first power P20 and the first power P30 are input to the main battery 33 and the house battery 35 via the power distributor 5, and the second power P21 and the second power P31 are output from the main battery 33 and the house battery 35 via the power distributor 5. On the other hand, the first power P10 is input to the electric motor battery 34 via the power distributor 5, and the second power P11 is output from the electric motor battery 34 without interposition of the power distributor 5.

The converter 36 is provided between the power distributor 5 and the electric motor battery 34. The converter 36 boosts a value of a voltage as the first power P10 supplied (output) to the electric motor battery 34 via the power distributor 5. For example, the converter 36 boosts a voltage of 12V to a voltage of 36 V or 48 V, for example.

The external connection power supply 37 is connectable to the external power supply (commercial power supply) outside the marine vessel 100. The external connection power supply 37 is connected to the power distributor 5 and supplies (inputs) power from the external power supply outside the marine vessel 100 to the power distributor 5. The external connection power supply 37 converts a current from an alternating current to a direct current and supplies the direct current to the power distributor 5.

The power distributor 5 is connected to the main battery 33, the electric motor battery 34, and the house battery 35, and supplies (distributes) the first power P20, the first power P10, and the first power P30 from the generator 29 to the main battery 33, the electric motor battery 34, and the house battery 35, respectively.

Specifically, the power distributor 5 includes a second current sensor 51a, a third current sensor 51b, a fourth current sensor 51c, a switch 52a provided in the second current sensor 51a, a switch 52b provided in the third current sensor 51b, and a switch 52c provided in the fourth current sensor 51c.

The second current sensor 51a is provided on the power distributor 5 side relative to the converter 36, and detects a value of a current that flows between the power distributor 5 and the electric motor battery 34. That is, the second current sensor 51a detects the value of the current as the first power P10 supplied (input) from the generator 29 to the electric motor battery 34 via the power distributor 5.

The third current sensor 51b detects values of currents that flow between the power distributor 5 and the main battery 33. That is, the third current sensor 51b detects the value of the current as the first power P20 supplied (input) from the generator 29 to the main battery 33 via the power distributor 5. Furthermore, the third current sensor 51b detects the value of the current as the second power P21 supplied (output) from the main battery 33 to the starter motor 25 via the power distributor 5.

The fourth current sensor 51c detects values of currents that flow between the power distributor 5 and the house battery 35. That is, the fourth current sensor 51c detects the value of the current as the first power P30 supplied (input) from the power distributor 5 to the house battery 35. Furthermore, the fourth current sensor 51c detects the value of the current as the second power P31 supplied (output) from the house battery 35 to a predetermined device in the marine vessel 100 via the power distributor 5.

The values of the currents detected by the second current sensor 51a, the third current sensor 51b, and the fourth current sensor 51c are acquired by the hybrid controller 31.

The switch 52a opens and closes an electric circuit between the power distributor 5 and the electric motor battery 34. The second current sensor 51a is provided in the electric circuit between the switch 52a and the electric motor battery 34.

The switch 52b opens and closes an electric circuit between the power distributor 5 and the main battery 33. The third current sensor 51b is provided in the electric circuit between the switch 52b and the main battery 33.

The switch 52c opens and closes an electric circuit between the power distributor 5 and the house battery 35. The fourth current sensor 51c is provided in the electric circuit between the switch 52c and the house battery 35.

The open states and the closed states of the switch 52a, the switch 52b, and the switch 52c are switched by the hybrid controller 31.

The hybrid controller 31 includes a control circuit that controls both driving of the engine 21 in the outboard motor 2 and driving of the electric motor 22 in the outboard motor 2. For example, the hybrid controller 31 includes a processor, such as a CPU, that performs an arithmetic process.

The hybrid controller 31 acquires the value of the current as the first power P10 supplied (input) to the electric motor battery 34 based on the value of the current detected by the second current sensor 51a. Furthermore, the hybrid controller 31 acquires the value of the current as the second power P11 supplied (output) to the electric motor 22 based on the value of the current detected by the first current sensor 28a.

Then, the hybrid controller 31 performs a control to acquire the charge amount of the electric motor battery 34 based on the value of the current as the first power P10 detected by the second current sensor 51a and the value of the current as the second power P11 detected by the first current sensor 28a. For example, the hybrid controller 31 acquires the charge amount of the electric motor battery 34 by adding a value (charging power) obtained by multiplying a value of a current as the first power P10 (power input to the motor battery 34) by a value of the voltage of the motor battery 34 to a value obtained by subtracting a value (consumed power) obtained by multiplying a value of a current as the second power P11 (power output from the motor battery 34) by a value of the voltage of the motor battery 34 from a value of power based on a fully charged state.

The hybrid controller 31 acquires the value of the current as the first power P20 supplied (input) to the main battery 33 based on the value of the current detected by the third current sensor 51b. Furthermore, the hybrid controller 31 acquires the value of the current as the second power P21 supplied (output) from the main battery 33 to the starter motor 25 based on the value of the current detected by the third current sensor 51b.

Then, the hybrid controller 31 performs a control to acquire the charge amount of the main battery 33 based on the value of the current as the first power P20 detected by the third current sensor 51b and the value of the current as the second power P21 detected by the third current sensor 51b.

The hybrid controller 31 acquires the value of the current as the first power P30 supplied (input) to the house battery 35 based on the value of the current detected by the fourth current sensor 51c. Furthermore, the hybrid controller 31 acquires the value of the current as the second power P31 supplied (output) from the house battery 35 to the predetermined device in the marine vessel 100 based on the value of the current detected by the fourth current sensor 51c.

Then, the hybrid controller 31 performs a control to acquire the charge amount of the house battery 35 based on the value of the current as the first power P30 detected by the fourth current sensor 51c and the value of the current as the second power P31 detected by the fourth current sensor 51c.

The hybrid controller 31 performs a control to stop a power supply to the electric motor battery 34 when the charge amount C1 of the main battery 33 is equal to or less than a charge amount threshold T1. Specifically, the hybrid controller 31 stops a power supply to the electric motor battery 34 by opening (turning off) the switch 52a of the power distributor 5. The flow of this control process is described below with reference to a flowchart shown in FIG. 4.

The hybrid controller 31 transmits predetermined charging information regarding the charge amount of the electric motor battery 34 to the inverter control device 28 in order for the inverter control device 28 to perform a control to stop driving of the electric motor 22 based on the charge amount of the electric motor battery 34.

For example, the hybrid controller 31 transmits the predetermined charging information indicating that the charge amount C2 of the electric motor battery 34 has become a charge amount threshold T2 or less to the inverter control device 28 when the charge amount C2 of the electric motor battery 34 becomes equal to or less than the charge amount threshold T2. Then, the inverter control device 28 performs a control to stop driving of the electric motor 22 based on the predetermined charging information. The flow of this control process is described below with reference to a flowchart of FIG. 5.

Figure 4:
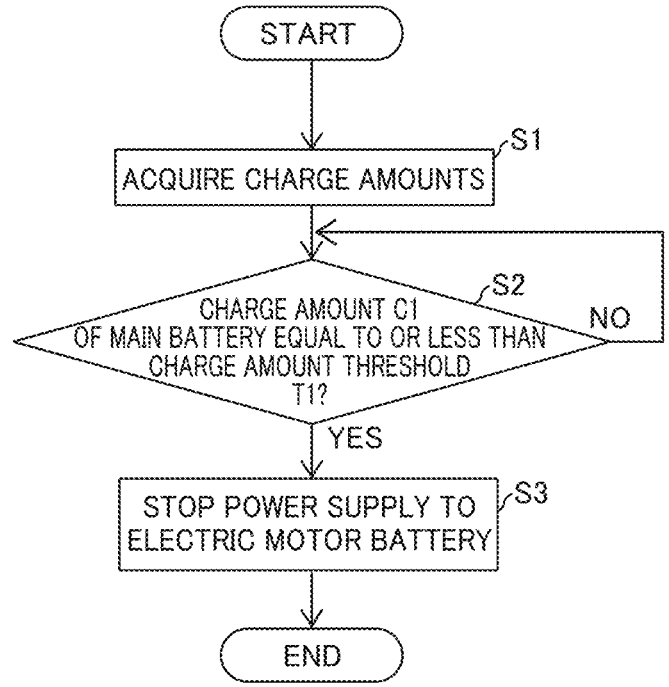
FIG. 4 is a flowchart showing a control process performed when the charge amount of a main battery of the marine propulsion system is reduced according to the first preferred embodiment of the present invention.

The control process executed by the hybrid controller 31 when the charge amount of the main battery 33 is reduced is now described with reference to the flowchart of FIG. 4.

In step S1, the charge amounts of the main battery 33, the electric motor battery 34, and the house battery 35 are acquired based on the values of the currents detected by the first current sensor 28a, the second current sensor 51a, the third current sensor 51b, and the fourth current sensor 51c. Then, the process advances to step S2.

In step S2, it is determined whether or not the charge amount C1 of the main battery 33 is equal to or less than the charge amount threshold T1. When the charge amount C1 of the main battery 33 is equal to or less than the charge amount threshold T1, the process advances to step S3. When the charge amount C1 of the main battery 33 is greater than the charge amount threshold T1, the process operation in step S2 is repeated.

In step S3, the switch 52a of the power distributor 5 is opened such that a power supply to the electric motor battery 34 is stopped.

Figure 5:
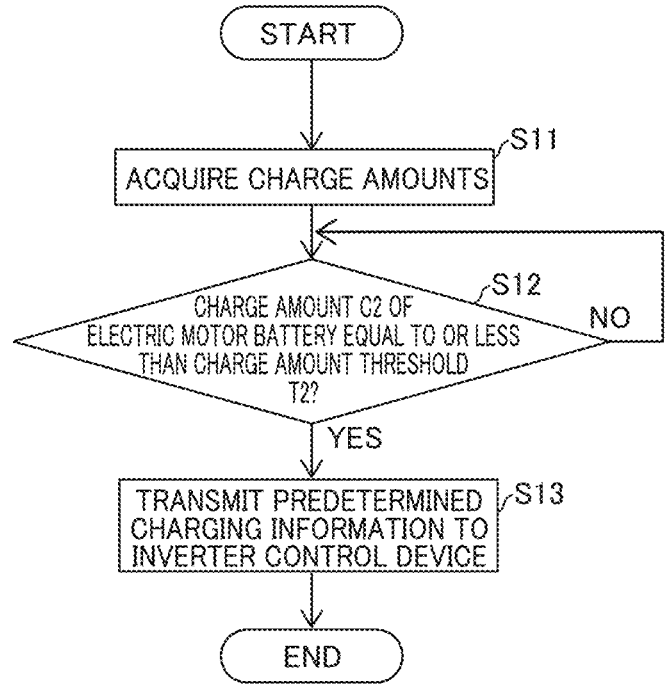
FIG. 5 is a flowchart showing a control process performed when the charge amount of an electric motor battery of the marine propulsion system is reduced according to the first preferred embodiment of the present invention.

The control process executed by the hybrid controller 31 when the charge amount of the electric motor battery 34 is reduced is now described with reference to the flowchart of FIG. 5.

In step S11, the charge amounts of the main battery 33, the electric motor battery 34, and the house battery 35 are acquired based on the values of the currents detected by the first current sensor 28a, the second current sensor 51a, the third current sensor 51b, and the fourth current sensor 51c. Then, the process advances to step S12.

In step S12, it is determined whether or not the charge amount C2 of the electric motor battery 34 is equal to or less than the charge amount threshold T2. When the charge amount C2 of the electric motor battery 34 is equal to or less than the charge amount threshold T2, the process advances to step S13. When the charge amount C2 of the electric motor battery 34 is greater than the charge amount threshold T2, the process operation in step S12 is repeated.

In step S13, the predetermined charging information is transmitted to the inverter control device 28. Consequently, the inverter control device 28 performs a control to stop driving of the electric motor 22 based on the predetermined charging information.

According to the first preferred embodiment of the present invention, the following advantageous effects are achieved.

According to the first preferred embodiment of the present invention, the marine propulsion system 1*a* includes the hybrid controller 31 configured or programmed to perform a control to acquire the charge amount of at least one of the main battery 33, the electric motor battery 34, or the house battery 35 based on the first power P20, the first power P10, and the first power P30 supplied from the power source (generator 29) to the main battery 33, the electric motor battery 34, and the house battery 35, respectively, and the second power P21, the second power P11, and the second power P31 supplied from the main battery 33, the electric motor battery 34, and the house battery 35 to the devices in or on the marine vessel 100, respectively. Accordingly, the hybrid controller 31 acquires the charge amounts of the main battery 33, the electric motor battery 34, and the house battery 35 based on the first power P20, the first power P10, and the first power P30 and the second power P21, the second power P11, and the second power P31. That is, the charge amounts of the batteries (the main battery 33, the electric motor battery 34, and the house battery 35) that supply power to the devices in or on the marine vessel 100 are known. When the charge amounts of at least two of the main battery 33, the electric motor battery 34, or the house battery 35 is known, necessary power management is performed according to the importance of a supply destination to which power is supplied. When the charge amounts of the batteries (the main battery 33 and the electric motor battery 34) used to drive the propeller 23 are known, a predetermined control to provide required power is performed in order to maintain driving of the marine vessel 100 until returning to port.

According to the first preferred embodiment of the present invention, the marine propulsion system 1*a* further includes the power distributor 5 connected to the main battery 33, the electric motor battery 34, and the house battery 35 to distribute the first power P20, the first power P10, and the first power P30 from the power source (generator 29) to the main battery 33, the electric motor battery 34, and the house battery 35, respectively; the main battery 33 and the house battery 35 supply the second power P21 and the second power P31 to the devices in or on the marine vessel 100 via the power distributor 5; and the electric motor battery 34 supplies the second power P11 to the electric motor 22 without interposition of the power distributor 5. Accordingly, in the power distributor 5, at least the first power P20, the first power P30, the second power P21, and the second power P31 of the main battery 33 and the house battery 35 are acquired, and at least the first power P10 of the electric motor battery 34 is acquired. Therefore, the charge amounts of the main battery 33, the electric motor battery 34, and the house battery 35 that supply power to the devices in or on the marine vessel 100 are easily known.

According to the first preferred embodiment of the present invention, the hybrid controller 31 is configured or programmed to perform a control to acquire the value of the current as the first power P10 supplied to the electric motor battery 34 based on the value of the current that flows from the power distributor 5 to the electric motor battery 34, acquire the value of the current as the second power P11 supplied to the electric motor 22 based on the value of the current that flows from the electric motor battery 34 to the electric motor 22, and acquire the charge amount of the electric motor battery 34 based on the value of the current as the first power P10 and the value of the current as the second power P11. Accordingly, the value of the current as the first power P10 supplied to the electric motor battery 34 is acquired based on the value of the current that flows from the power distributor 5 to the electric motor battery 34, and the value of the current as the second power P11 supplied to the electric motor 22 is acquired based on the value of the current that flows from the electric motor battery 34 to the electric motor 22. Consequently, the charge amount of the electric motor battery 34 is reliably known based on the value of the current.

According to the first preferred embodiment of the present invention, the electric motor 22 includes the power converter (inverter control device 28) to convert the current as the second power P11 supplied from the electric motor battery 34 from a direct current to an alternating current, the power converter includes the first current sensor 28*a* to detect the value of the current supplied to the electric motor 22, and the hybrid controller 31 is configured or programmed to perform a control to acquire the value of the current as the first power P10 supplied to the electric motor battery 34 based on the value of the current detected by the first current sensor 28*a* and acquire the charge amount of the electric motor battery 34 based on the value of the current as the first power P10 and the value of the current as the second power P11. Accordingly, the value of the current as the second power P11 supplied from the electric motor battery 34 is acquired by the first current sensor 28*a* of the power converter provided in the electric motor 22. Thus, as compared with a case in which a dedicated current sensor is provided to acquire the value of the current as the second power P11, the number of components is reduced, and the system structure is simplified.

According to the first preferred embodiment of the present invention, the marine propulsion system 1*a* further includes the converter 36 provided between the power distributor 5 and the electric motor battery 34 to boost the value of the voltage as the first power P10, and the second current sensor 51*a* provided on the power distributor 5 side relative to the converter 36 to detect the value of the current that flows between the power distributor 5 and the electric motor battery 34, and the hybrid controller 31 is configured or programmed to perform a control to acquire the value of the current as the first power P10 supplied to the electric motor battery 34 based on the value of the current detected by the second current sensor 51*a* and acquire the charge amount of the electric motor battery 34 based on the value of the current as the first power P10 and the value of the current as the second power P11. Accordingly, the value of the current as the first power P10 supplied to the electric motor battery 34 is acquired by the second current sensor 51*a* on the upstream side in the current flow direction relative to the converter 36, and thus as compared with a case in which the current sensor is provided on the downstream side relative to the converter 36, the system structure on the downstream side relative to the converter 36 is simplified.

According to the first preferred embodiment of the present invention, the power distributor 5 includes the second current sensor 51*a*, and the hybrid controller 31 is configured or programmed to perform a control to acquire the value of the current as the first power P10 supplied to the electric motor battery 34 based on the value of the current detected by the second current sensor 51*a* and acquire the charge amount of the electric motor battery 34 based on the value of the current as the first power P10 and the value of the current as the second power P11. Accordingly, the second current sensor 51a of the power distributor 5 acquires the value of the current as the first power P10 supplied to the electric motor battery 34. Thus, as compared with a case in which a dedicated current sensor is provided to acquire the value of the current as the first power P10, the number of components is reduced, and the system structure is simplified.

According to the first preferred embodiment of the present invention, the power distributor 5 includes the third current sensor 51b to detect the value of the current that flows between the power distributor 5 and the main battery 33, and the hybrid controller 31 is configured or programmed to perform a control to acquire the charge amount of the main battery 33 based on the value of the current as the first power P20 supplied to the main battery 33 as detected by the third current sensor 51b, and the value of the current as the second power P21. Accordingly, the two second and third current sensors 51a and 51b are integrated into the power distributor 5, and thus the system structure is further simplified.

According to the first preferred embodiment of the present invention, the hybrid controller 31 is configured or programmed to perform a control to limit or stop a power supply to the electric motor battery 34 when the charge amount of the main battery 33 is equal to or less than the charge amount threshold. Accordingly, the amount of power supplied to the electric motor battery 34 having the power source (generator 29) common to the main battery 33 is reduced or reduced to zero, and thus the amount of power supplied to the main battery 33 is increased.

According to the first preferred embodiment of the present invention, the power distributor 5 includes the fourth current sensor 51c to detect the value of the current that flows between the power distributor 5 and the house battery 35, and the hybrid controller 31 is configured or programmed to perform a control to acquire the charge amount of the house battery 35 based on the value of the current as the first power P30 supplied to the house battery 35 as detected by the fourth current sensor 51c, and the value of the current as the second power P31. Accordingly, the three second, third, and fourth current sensors 51a, 51b, and 51c are integrated into the power distributor 5, and thus the system structure is further simplified.

According to the first preferred embodiment of the present invention, the marine propulsion system 1a further includes the electric motor controller (inverter control device 28) to perform a control to limit or stop driving of the electric motor 22 based on the charge amount of the electric motor battery 34. Accordingly, when the charge amount of the electric motor battery 34 is not sufficient, the amount of power supplied to the electric motor 22 is reduced or reduced to zero, and thus the power consumption of the electric motor battery 34 is reduced.

According to the first preferred embodiment of the present invention, the power source includes the generator 29 mounted on the outboard motor 2 to generate power when the engine 21 is driven. Accordingly, the generator 29 generates power to supply the power to the main battery 33, the electric motor battery 34, and the house battery 35.

According to the first preferred embodiment of the present invention, the electric motor battery 34 is a lead storage battery. Accordingly, even in the lead storage battery (electric motor battery 34) that generally does not directly include a current sensor, the charge amount is known based on the first power P10 supplied to the lead storage battery and the second power P11 supplied from the lead storage battery.

Second Preferred Embodiment

A second preferred embodiment of the present invention is now described with reference to FIG. 6. In the second preferred embodiment, an electric motor battery 234 is a lithium-ion battery, unlike the first preferred embodiment in which the electric motor battery 34 is a lead storage battery. In the figures, the same or similar structures as those of the first preferred embodiment are denoted by the same reference numerals.

A marine propulsion system 201a of a marine vessel 200 according to the second preferred embodiment of the present invention includes an outboard motor 2 and a marine power supply system 203. The marine power supply system 203 includes the electric motor battery 234, which is a lithium-ion battery.

The electric motor battery 234 includes a fifth current sensor 234a.

The fifth current sensor 234a detects both a value of a current as a first power P10 supplied from a generator 29 to the electric motor battery 234 and a value of a current as a second power P11 supplied from the electric motor battery 234 to an electric motor 22.

The hybrid controller 31 performs a control to acquire the charge amount of the electric motor battery 234 based on the value of the current as the first power P10 supplied to the electric motor battery 234 as detected by the fifth current sensor 234a and the value of the current as the second power P11.

The remaining structures of the second preferred embodiment are similar to those of the first preferred embodiment.

According to the second preferred embodiment of the present invention, the following advantageous effects are achieved.

According to the second preferred embodiment of the present invention, the electric motor battery 234 is a lithium-ion battery, the lithium-ion battery includes the fifth current sensor 234a to detect the value of the current as the first power P10 supplied from the power source (generator 29) to the lithium-ion battery and the value of the current as the second power P11 supplied from the lithium-ion battery to the electric motor 22, and the hybrid controller 31 is configured or programmed to perform a control to acquire the charge amount of the lithium-ion battery based on the value of the current as the first power P10 supplied to the lithium-ion battery as detected by the fifth current sensor 234a, and the value of the current as the second power P11. Accordingly, both the value of the current as the first power P10 supplied to the lithium-ion battery and the value of the current as the second power P11 supplied from the lithium-ion battery to the electric motor 22 are detected by the fifth current sensor 234a generally provided in the lithium-ion battery. Therefore, as compared with a case in which a current sensor that detects the value of the current as the first power P10 supplied to the lithium-ion battery and a current sensor that detects the value of the current as the second power P11 supplied from the lithium-ion battery to the electric motor 22 are provided separately from the lithium-ion battery, the number of components is reduced, and the system structure is simplified.

The remaining advantageous effects of the second preferred embodiment are similar to those of the first preferred embodiment.

The preferred embodiments of the present invention described above are illustrative in all points and not restrictive. The extent of the present invention is not defined by the above description of the preferred embodiments but by the scope of the claims, and all modifications within the meaning and range equivalent to the scope of the claims are further included.

For example, while the marine vessel is preferably an outboard motor boat in each of the first and second preferred embodiments described above, the present invention is not restricted to this. That is, the marine vessel may alternatively be a marine vessel other than an outboard motor boat. For example, the marine vessel may be a marine vessel including an inboard motor, an inboard-outboard motor, or a jet propulsion device.

While the main battery, the electric motor battery, and the house battery are preferably provided in the hull in each of the first and second preferred embodiments described above, the present invention is not restricted to this. That is, at least one of the main battery, the electric motor battery, or the house battery may alternatively be provided in the outboard motor.

While the electric motor battery is preferably a lead storage battery in the first preferred embodiment described above, and the electric motor battery is preferably a lithium-ion battery in the second preferred embodiment described above, the present invention is not restricted to this. In the present invention, the electric motor battery may alternatively be a battery other than a lead storage battery and a lithium-ion battery, such as a lithium battery.

While the generator is preferably provided in the outboard motor in each of the first and second preferred embodiments described above, the present invention is not restricted to this. For example, the generator may alternatively be provided in the hull.

While the hybrid controller preferably acquires the charge amounts of all of the main battery, the electric motor battery, and the house battery in each of the first and second preferred embodiments described above, the present invention is not restricted to this. In the present invention, the hybrid controller may alternatively acquire the charge amounts of only one or two of the main battery, the electric motor battery, and the house battery.

While the charge amounts of the main battery, the electric motor battery, and the house battery are preferably acquired based on the values of the currents detected by the current sensors in each of the first and second preferred embodiments described above, the present invention is not restricted to this. In the present invention, the charge amounts of the main battery, the electric motor battery, and the house battery may alternatively be acquired based on a value of a voltage detected by a voltmeter that measures the open end voltage of a battery. Alternatively, for the electric motor battery, the value of the voltage as the first power supplied to the electric motor battery may be detected by the converter.

While a control is preferably performed to stop a power supply to the electric motor battery when the charge amount of the main battery is equal to or less than the predetermined charge amount threshold in each of the first and second preferred embodiments described above, the present invention is not restricted to this. In the present invention, when the charge amount of the main battery is equal to or less than the predetermined charge amount threshold, a control may alternatively be performed to limit a power supply to the electric motor battery.

While a control is preferably performed to stop driving of the electric motor when the charge amount of the electric motor battery is equal to or less than the predetermined charge amount threshold in each of the first and second preferred embodiments described above, the present invention is not restricted to this. In the present invention, when the charge amount of the electric motor battery is equal to or less than the predetermined charge amount threshold, a control may alternatively be performed to limit driving of the electric motor.

While the process operations performed by the hybrid controller are described using flowcharts in a flow-driven manner in which processes are performed in order along a process flow for the convenience of illustration in each of the first and second preferred embodiments described above, the present invention is not restricted to this. In the present invention, the process operations performed by the hybrid controller may alternatively be performed in an event-driven manner in which the processes are performed on an event basis. In this case, the process operations performed by the hybrid controller may be performed in a complete event-driven manner or in a combination of an event-driven manner and a flow-driven manner.

While preferred embodiments of the present invention have been described above, variations and modifications will be apparent to those skilled in the art without departing from the scope and spirit of the present invention. The scope of the present invention, therefore, is to be determined solely by the following claims.

What is claimed is:

1. A marine power supply system for supplying power to a marine propulsion unit including a propulsion generator, an engine to drive the propulsion generator, and an electric motor to drive the propulsion generator, the marine power supply system comprising:
    a first battery to supply power to a starter to start the engine;
    a second battery to supply power to the electric motor;
    a third battery to supply power to at least one of a plurality of devices in or on a marine vessel excluding the starter and the electric motor;
    a charge amount acquisition controller configured or programmed to perform a control to acquire a charge amount of at least one of the first battery, the second battery, or the third battery based on a first power supplied from a power source to the first battery, the second battery, and the third battery, and a second power supplied from the first battery, the second battery, and the third battery to devices in or on the marine vessel; and
    a power distributor connected to the first battery, the second battery, and the third battery to distribute the first power from the power source to the first battery, the second battery, and the third battery; wherein
    the first battery and the third battery supply the second power to the devices in or on the marine vessel via the power distributor; and
    the second battery supplies the second power to the electric motor without the power distributor being interposed between the second battery and the electric motor.

2. The marine power supply system according to claim 1, wherein
    the charge amount acquisition controller is configured or programmed to perform a control to:

acquire a value of a current as the first power supplied to the second battery based on a value of a current that flows from the power distributor to the second battery;

acquire a value of a current as the second power supplied to the electric motor based on a value of a current that flows from the second battery to the electric motor; and acquire the charge amount of the second battery based on the value of the current as the first power and the value of the current as the second power.

3. The marine power supply system according to claim 1, further comprising:

an electric motor controller configured or programmed to perform a control to limit or stop driving of the electric motor based on the charge amount of the second battery.

4. The marine power supply system according to claim 1, wherein the second battery is a lead storage battery.

5. A marine propulsion system comprising:

a marine propulsion unit including a propulsion generator, an engine to drive the propulsion generator, and an electric motor to drive the propulsion generator;

a first battery to supply power to a starter to start the engine;

a second battery to supply power to the electric motor;

a third battery to supply power to at least one of a plurality of devices in or on a marine vessel excluding the starter and the electric motor;

a charge amount acquisition controller configured or programmed to perform a control to acquire a charge amount of at least one of the first battery, the second battery, or the third battery based on a first power supplied from a power source to the first battery, the second battery, and the third battery, and a second power supplied from the first battery, the second battery, and the third battery to devices in or on the marine vessel; and a power distributor connected to the first battery, the second battery, and the third battery to distribute the first power from the power source to the first battery, the second battery, and the third battery; wherein the first battery and the third battery supply the second power to the devices in or on the marine vessel via the power distributor; and the second battery supplies the second power to the electric motor without the power distributor being interposed between the second battery and the electric motor.

6. The marine propulsion system according to claim 5, wherein the charge amount acquisition controller is configured or programmed to perform a control to:

acquire a value of a current as the first power supplied to the second battery based on a value of a current that flows from the power distributor to the second battery;

acquire a value of a current as the second power supplied to the electric motor based on a value of a current that flows from the second battery to the electric motor; and acquire the charge amount of the second battery based on the value of the current as the first power and the value of the current as the second power.

7. The marine propulsion system according to claim 6, wherein the electric motor includes a power converter to convert the current as the second power supplied from the second battery from a direct current to an alternating current;

the power converter includes a first current sensor to detect the value of the current supplied to the electric motor; and the charge amount acquisition controller is configured or programmed to perform a control to:

acquire the value of the current as the first power supplied to the second battery based on the value of the current detected by the first current sensor; and acquire the charge amount of the second battery based on the value of the current as the first power and the value of the current as the second power.

8. The marine propulsion system according to claim 6, further comprising:

a converter provided between the power distributor and the second battery to boost a value of a voltage as the first power; and a second current sensor provided on a power distributor side relative to the converter to detect a value of a current that flows between the power distributor and the second battery; wherein the charge amount acquisition controller is configured or programmed to perform a control to:

acquire the value of the current as the first power supplied to the second battery based on the value of the current detected by the second current sensor; and acquire the charge amount of the second battery based on the value of the current as the first power and the value of the current as the second power.

9. The marine propulsion system according to claim 8, wherein the power distributor includes the second current sensor; and the charge amount acquisition controller is configured or programmed to perform a control to:

acquire the value of the current as the first power supplied to the second battery based on the value of the current detected by the second current sensor; and acquire the charge amount of the second battery based on the value of the current as the first power and the value of the current as the second power.

10. The marine propulsion system according to claim 9, wherein the power distributor includes a third current sensor to detect a value of a current that flows between the power distributor and the first battery; and the charge amount acquisition controller is configured or programmed to perform a control to acquire the charge amount of the first battery based on the value of the current as the first power supplied to the first battery as detected by the third current sensor, and the value of the current as the second power.

11. The marine propulsion system according to claim 10, wherein the charge amount acquisition controller is configured or programmed to perform a control to limit or stop a power supply to the second battery when the charge amount of the first battery is equal to or less than a charge amount threshold.

12. The marine propulsion system according to claim 10, wherein the power distributor includes a fourth current sensor to detect a value of a current that flows between the power distributor and the third battery; and the charge amount acquisition controller is configured or programmed to perform a control to acquire the charge amount of the third battery based on the value of the current as the first power supplied to the third battery as detected by the fourth current sensor, and the value of the current as the second power.

13. The marine propulsion system according to claim 5, further comprising:

an electric motor controller configured or programmed to perform a control to limit or stop driving of the electric motor based on the charge amount of the second battery.

14. The marine propulsion system according to claim 5, wherein the power source includes a generator mounted on the marine propulsion unit to generate power when the engine is driven.

15. The marine propulsion system according to claim 5, wherein the second battery is a lead storage battery.

16. The marine propulsion system according to claim 5, wherein the second battery is a lithium-ion battery;

the lithium-ion battery includes a fifth current sensor to detect a value of a current as the first power supplied from the power source to the lithium-ion battery and a value of a current as the second power supplied from the lithium-ion battery to the electric motor; and the charge amount acquisition controller is configured or programmed to perform a control to acquire a charge amount of the lithium-ion battery based on the value of the current as the first power supplied to the lithium-ion battery as detected by the fifth current sensor, and the value of the current as the second power.

* * * * *